United States Patent [19]

Kim et al.

[11] Patent Number: 5,789,948
[45] Date of Patent: Aug. 4, 1998

[54] SENSE AMPLIFIER

[75] Inventors: Seung Min Kim; Sung Jun Jang, both of Kyoungkido, Rep. of Korea

[73] Assignee: Hyundai Electronics Industries Co., Ltd., Kyoungkido, Rep. of Korea

[21] Appl. No.: 773,564

[22] Filed: Dec. 27, 1996

[30] Foreign Application Priority Data

Dec. 28, 1995 [KR] Rep. of Korea .................. 1995-62106

[51] Int. Cl.$^6$ .............................. G11C 7/06; G01R 19/00
[52] U.S. Cl. .................... 327/55; 327/53; 327/57
[58] Field of Search ....................... 327/51–55, 57

[56] References Cited

U.S. PATENT DOCUMENTS

| | | |
|---|---|---|
| 4,604,533 | 8/1986 | Miyamoto et al. ............ 327/53 |
| 4,618,785 | 10/1986 | Van Tran .................. 327/53 |
| 4,724,344 | 2/1988 | Wanatabe .................. 327/53 |
| 4,829,479 | 5/1989 | Mitsumoto et al. ........ 365/189.09 |
| 5,034,636 | 7/1991 | Reis et al. ................ 327/52 |
| 5,508,643 | 4/1996 | Khieu ..................... 327/53 |
| 5,577,001 | 11/1996 | Sandhu .................... 327/53 |

Primary Examiner—Toan Tran
Attorney, Agent, or Firm—Jacobson, Price, Holman & Stern, PLLC

[57] ABSTRACT

The present invention provides a sense amplifier with high speed and stable sensing capabilities under a low supplying voltage. In accordance with the present invention, there is disclosed a sense amplifier comprising: a voltage level shifter for shifting a voltage level of data from a memory cell in response to a sense amplifier enable signal; a current mirror type sense amplifying stage for amplifying the level-shifted data from the voltage level shifter to full range in response to the sense amplifier enable signal; and a driver means for driving the amplified data from the current mirror type sense amplifying stage.

18 Claims, 3 Drawing Sheets

SENSE AMPLIFIER

FIELD OF THE INVENTION

This invention relates to a sense amplifier for a semiconductor SRAM (Static Random Access Memory) device, and more particularly to a sense amplifier operable under a lower supplying voltage by level shifting the cell data from a memory cell of the SRAM and providing an enough sensing margin to a memory device.

BACKGROUND OF THE INVENTION

Generally, a semiconductor memory device includes an address decoding circuit part for decoding address signals, a memory cell core part, a sense amplifier for sensing the cell data stored in a memory cell, data lines for transmitting the data from the sense amplifiers, and data output buffers.

Paired current mirror type sense amplifiers are used for sensing the above mentioned cell data. Referring to FIG. 1, FIG. 1 is a circuit diagram of a conventional paired current mirror type sense amplifier. As shown in the FIG. 1, the conventional sense amplifier includes a PMOS transistor P1 with the source coupled to the power line, a PMOS transistor P2 with the source coupled to the power line and the gate coupled to the gate of the PMOS transistor P1, a NMOS transistor N1 with the drain coupled to the gate and the drain of the PMOS transistor P1 and the gate coupled to a bit line, a NMOS transistor N2 with the drain coupled to the drain of the PMOS transistor P2 and the gate coupled to a bit bar line, and a NMOS transistor N3 with the drain coupled to the sources of the NMOS transistors N1 and N2, the gate coupled to the sense amplifier enable signal (SAE) used to control the operation of the sense amplifier and the source coupled to the ground.

Also, the sense conventional amplifier includes a PMOS transistor P3 with the source coupled to the power line, a PMOS transistor P4 with the source coupled to the power line and the gate and the source coupled to the gate of the PMOS transistor P3, a NMOS transistor N4 with the drain coupled to the drain of the PMOS transistor P3 and the gate coupled to the bit line, a NMOS transistor N5 with the drain coupled to the drain and the gate of the PMOS transistor P4 and the gate coupled to the bit bar line, and a NMOS transistor N6 with the drain coupled to the sources of the NMOS transistors N4 and N5, the gate coupled to the sense amplifier enable signal (SAE) and the source coupled to the ground.

Furthermore, the conventional sense amplifier includes a PMOS transistor P5 with the source coupled to the power line, a PMOS transistor P6 with the source coupled to the power line and the gate coupled to the gate of the PMOS transistor P5, an NMOS transistor N8 with the drain coupled to the gate and the drain of the PMOS transistor P5 and the gate coupled to the drain of the NMOS transistor N2, a NMOS transistor N9 with the drain coupled to the drain of the PMOS transistor P6 and the gate coupled to the drain of the NMOS transistor N4, a NMOS transistor N7 with the drain coupled to the sources of the NMOS transistors N8 and N9, the gate coupled to the sense amplifier enable signal (SAE) and the source coupled to the ground, a PMOS transistor P7 with the source couple to the power line, the gate is couple to the sense amplifier enable signal (SAE) and the drain couple to the drain of the NMOS transistor N9, and an inverter 1 with the input couple to the drain of the NMOS transistor N9.

The operation of the above mentioned conventional sense amplifier is as follows;

The data (RDB and RDBB) from the memory cell are applied to the NMOS transistors N1, N2, N3 and N4. The currents through the PMOS transistors P1, P2, P3 and P4 are controlled by the voltage level of the cell data (RDB and RDBB) applied to the NMOS transistors N1 and N5, and the drain voltage of the NMOS transistors N2 and N4 are controlled by the currents through the NMOS transistors N2 and N4.

The voltages of the drains of the NMOS transistors N2 and N4 are again applied to the gates of the NMOS transistors N8 and N9. The currents through the PMOS transistors P5 and P6 are controlled by the voltage applied to the NMOS transistor N8, and the drain voltage of the NMOS transistor N9 is controlled by the current through the NMOS transistors N9. The voltage of the drain of the NMOS transistor N9 is inverted by the inverter 1 and becomes an output signal (OUT) of the conventional sense amplifier. The sense amplifier enable signal (SAE) is applied to the gates of the NMOS transistors N3, N6 and N7 in order to control the operation of the sense amplifier.

However, the above mentioned conventional paired current mirror type sense amplifier has problems of decreased sensing speed and the deteriorated capability of data sensing as the supplying voltage becomes lower than 5 V, for example 3 V.

As the supplying voltage becomes lower than 5 V, the voltage level of the stored data becomes lower than that of 5 V case. The PMOS transistors are alternatively used as pull-up transistors because the signal margin of the bit line structure with NMOS pull-up transistors is decreased and the NMOS pull-up transistors can not transmit the cell data completely due to the lowered voltage level of data.

As a result, the voltage level of the data on the bit line or bit bar line is in the vicinity of the supplying voltage, and these voltage level is inadequate to the conventional current mirror type sense amplifier as an input voltage level.

SUMMARY OF THE INVENTION

Therefore, the present invention has been made in view of the above mentioned problem, and the present invention provides a sense amplifier with high speed and stable sensing capabilities under a low supplying voltage.

In accordance with the present invention, there is disclosed a sense amplifier comprising: a voltage level shifter for shifting a voltage level of data from a memory cell in response to a sense amplifier enable signal (SAE); and a current mirror type sense amplifying stage for amplifying the level-shifted data from the voltage level shifter to full range in response to the sense amplifier enable signal(SAE)

BRIEF DESCRIPTION OF THE DRAWINGS

A further understanding of the nature and advantage of the present invention will become apparent by reference to the remaining portions of the specification and drawings.

DETAILED DESCRIPTION OF THE PREFERRED EMBODIMENT

A detailed description of an embodiment according to the present invention will be given below with reference to FIGS. 2 to 3.

Figure 1:
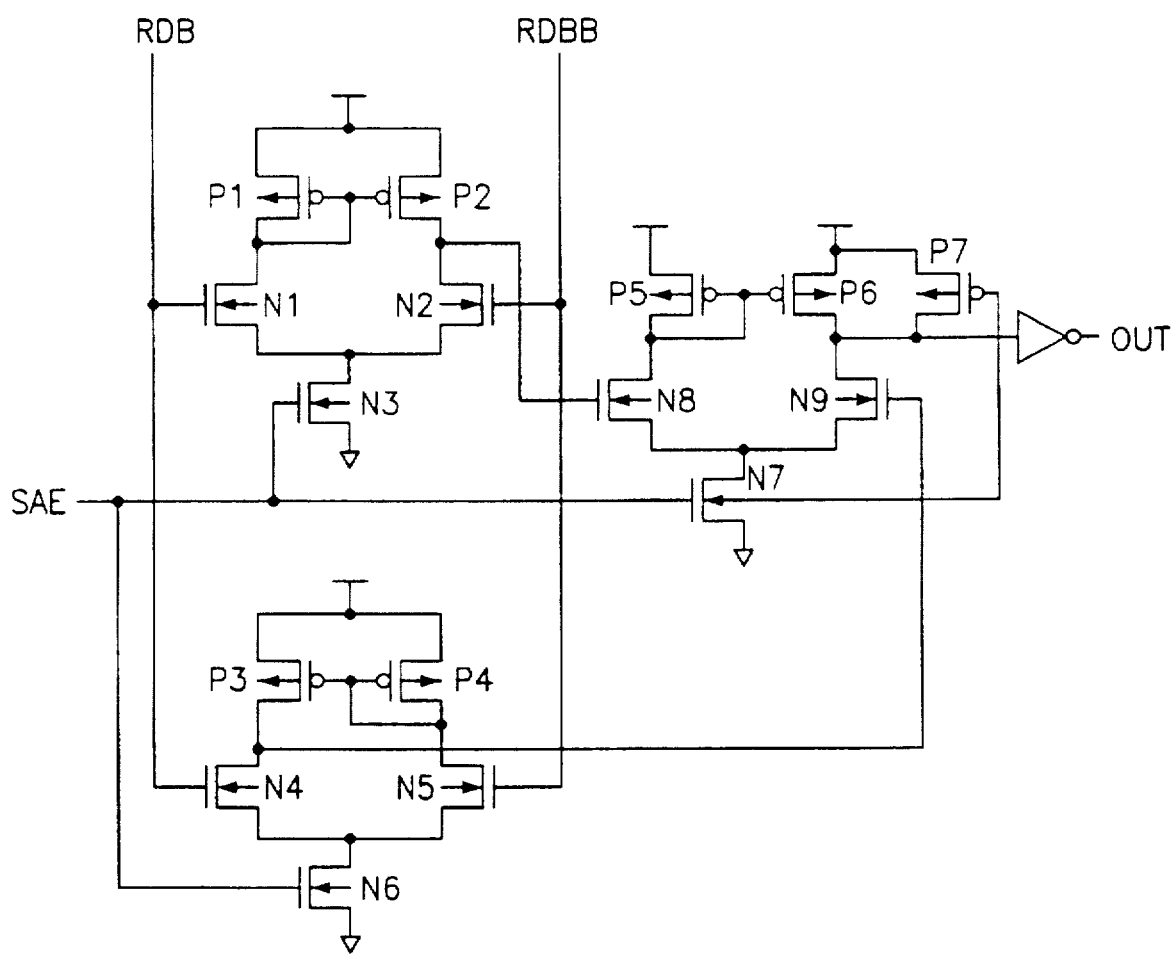
FIG. 1 is detailed circuit diagram of a conventional sense amplifier.
Figure 2:
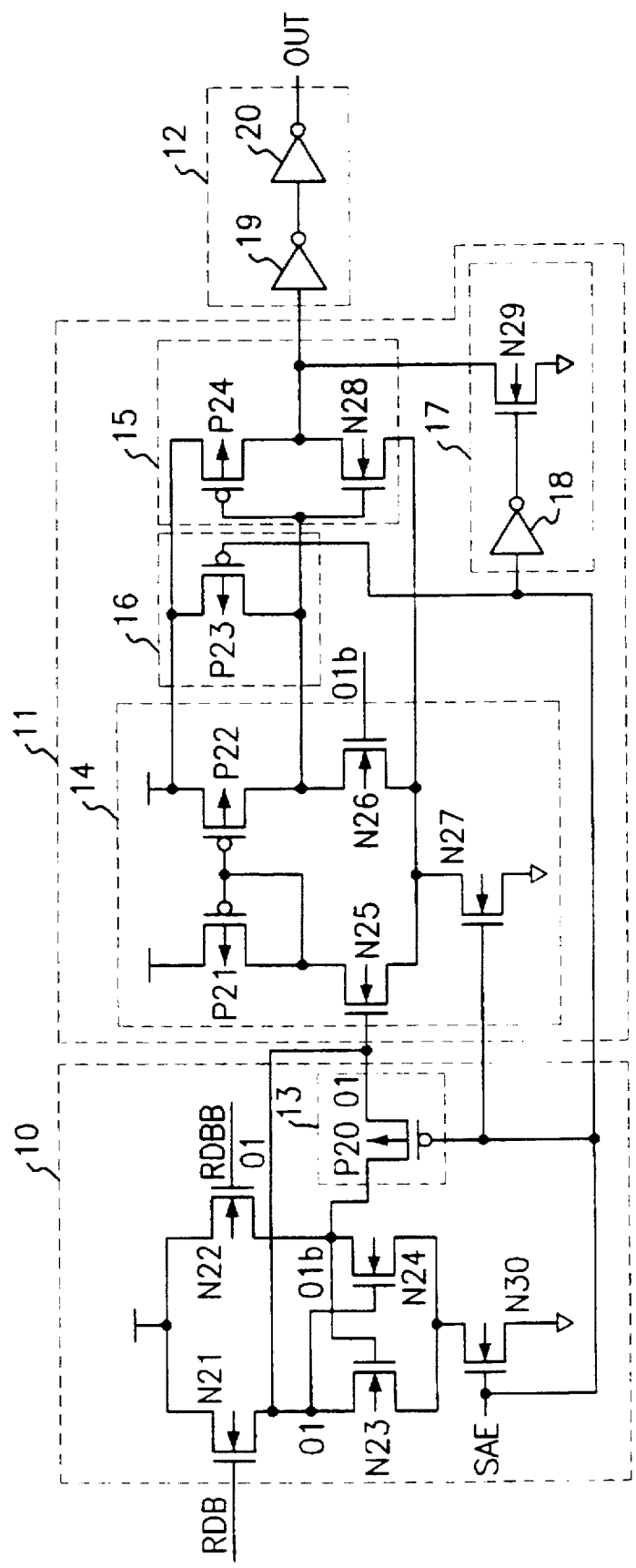
FIG. 2 is detailed circuit diagram of a sense amplifier of the present invention.

First, referring to FIG. 2, the sense amplifier of the present invention includes a voltage level shifter 10, a current mirror type sense amplifying stage 11 and a driver means 12.

The voltage level shifter 10 shifts the voltage level of the data (RDB and RDBB) from the memory cell by controlling the amount of current flow in response to the sense amplifier enable signal (SAE). The voltage level shifter 10 includes a NMOS transistor N21 with the drain coupled to the power line and the gate coupled to the bit line, a NMOS transistor N22 with the drain coupled to the power line and the gate coupled to the bit bar line, a NMOS transistor N23 with the drain coupled to the source of the NMOS transistor N21 and the gate coupled to the source of the NMOS transistor N22, a NMOS transistor N24 with the drain coupled to the source of the NMOS transistor N22 and the gate coupled to the source of the NMOS transistor N21, a NMOS transistor N30 with the drain coupled to the sources of the NMOS transistors N23 and N24, the gate coupled to the sense amplifier enable signal (SAE) and the source coupled to the ground, and a node stabilizing means 13 for equalizing the voltages of the sources of the NMOS transistors N21 and N22 in the standby mode in response to the sense amplifier enable signal (SAE).

The node stabilizing means 13 includes a PMOS transistor P20 with gate coupled to the sense amplifier enable signal (SAE), the source coupled to the source of the NMOS transistor N22 and the drain coupled to the input of the current mirror type sense amplifying stage 11.

The current mirror type sense amplifying stage 11 amplifies the output signal of the voltage level shifter 10 to full range in response to the sense amplifier enable signal (SAE). The current mirror type sense amplifying stage 11 includes a current mirror sense amplifier 14 for amplifying the output signal (O1 and O1B) from the voltage level shifter 10, an invert sense amplifier 15 for amplifying the output signal from the current mirror sense amplifier 14 to full range, whereby the sense amplifier can be supported by enough input signal margin even under the lower supplying voltage than 5 V, a node stabilizing means 16 for stabilizing the output signal of the current mirror sense amplifier 14 and removing leakage currents in response to the sense amplifier enable signal (SAE), and a node stabilizing means 17 for stabilizing the output signal of the invert sense amplifier 15 and removing leakage currents in response to the sense amplifier enable signal(SAE).

The node stabilizing means 16 includes a PMOS transistor 23 with the source coupled to the power line, the drain coupled to the output of the current mirror sense amplifier 14 and the gate coupled to the sense amplifier enable signal (SAE).

The node stabilizing means 17 includes an inverter 18 for inverting the sense amplifier enable signal (SAE), and an NMOS transistor N29 with the gate coupled to the output of the inverter 18, the drain coupled to the output of the invert sense amplifier 15 and the source coupled to the ground.

The current mirror sense amplifier 14 includes a PMOS transistor P21 with the source coupled to the power line, a PMOS transistor P22 with the source coupled to the power line, the gate coupled to the gate of the PMOS transistor P21 and the source coupled to the node stabilizing means 16, a NMOS transistor N25 with the drain coupled to the gate and the drain of the PMOS transistor P21 and the gate coupled to the output (O1) of the voltage level shifter 10, a NMOS transistor N26 with the drain coupled to the drain of the PMOS transistor P22 and the gate coupled to the output bar (O1B) of the voltage level shifter 10, and a NMOS transistor N27 with the drain coupled to the sources of the NMOS transistors N25 and N26 and the gate coupled to the sense amplifier enable signal(SAE) and the source coupled to the ground.

The invert sense amplifier includes a PMOS transistor P24 with the source coupled to the power line, the gate coupled to the output of the current mirror sense amplifier 14 through the node stabilizing means 16 and the drain coupled to the driver means 12, and an NMOS transistor N28 with the drain coupled to the drain of the PMOS transistor P24, the gate coupled to the output of the current mirror sense amplifier 14 through the node stabilizing means 16 and the source coupled to the current mirror sense amplifier 14.

The driver means 12 drives the output signal from the current mirror type sense amplifying stage 11. The driver means 12 includes a inverter 19 for inverting the output signal from the current mirror type sense amplifying stage 11, and a inverter 20 for inverting the output signal from the inverter 19.

Figure 3:
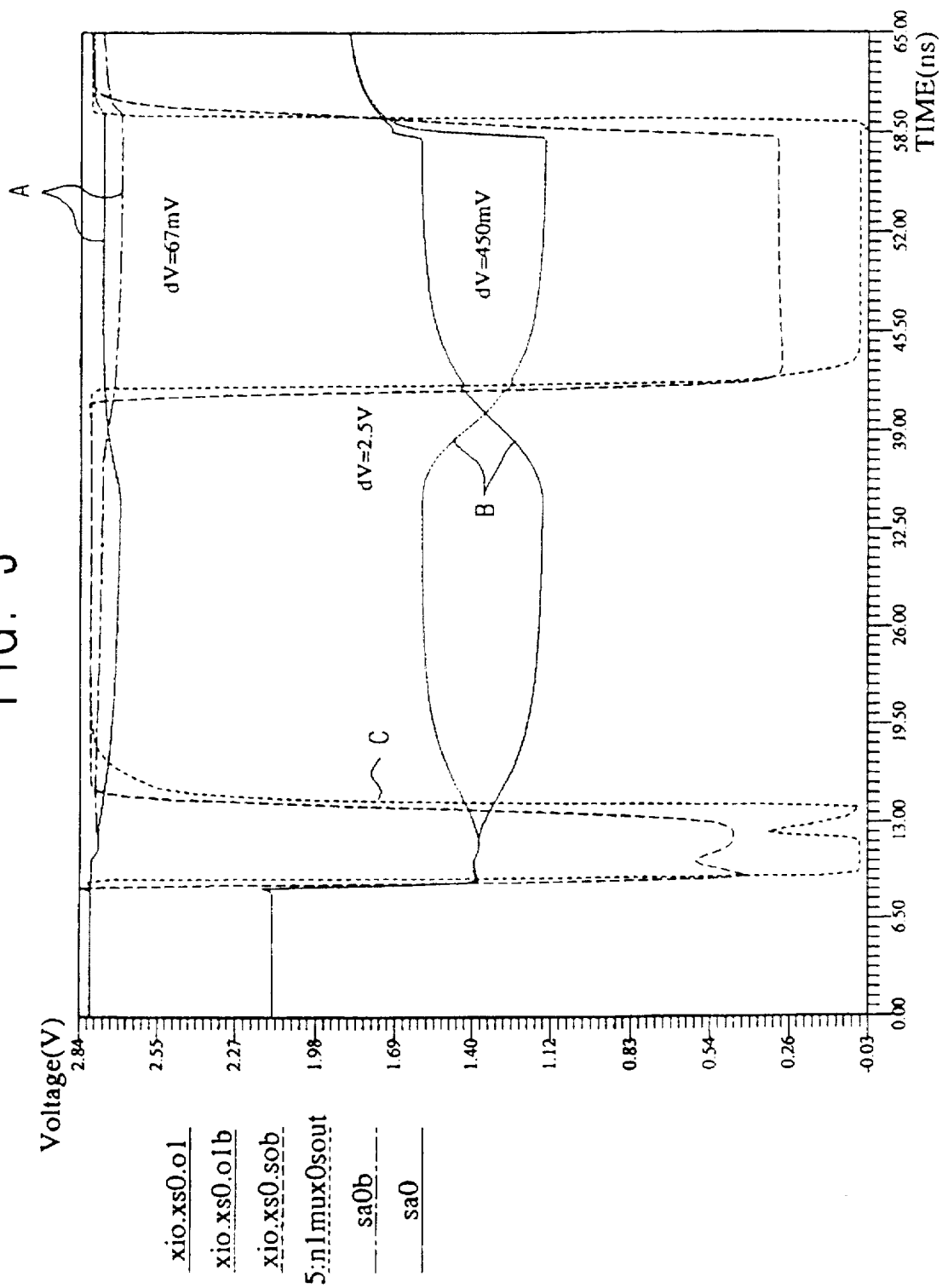
FIG. 3 is a timing diagram showing the operation of a sense amplifier of the present invention.

Now, referring to FIG. 3, FIG. 3 is the timing diagram of the sense amplifier of the present invention. The data (RDB and RDBB) on the bit line and bit bar line from the memory cell are applied to the voltage level shifter 10. The voltage level of the applied cell data (RDB and RDBB) is shifted to about the mid level between the supplying voltage and the ground. Also, as described above, since the voltage level shifter 10 includes a cross coupled NMOS transistors N23 and N24, the voltage level shifter 10 operates as an amplifier with some gain, and as a result, the applied cell data (RDB and RDBB) is amplified during the level shifting. In other words, the voltage level shifter 10 of the present invention provides shifted and amplified outputs(O1 and O1B). The NMOS transistor N30 confines the whole amount of current flow in response to the sense amplifier enable signal (SAE).

During the standby mode, the output signals (O1 and O1B) of the voltage level shifter 10 is maintained as the same value by the node stabilizing means 13, and the reliable operation can be achieved.

In FIG. 3, the cell data (RDB and RDBB) is denoted as A and the output signals (O1 and O1B) of the voltage level shifter 10 is denoted as B.

The output signals (O1 and O1B) of the voltage level shifter 10 is then applied to the current mirror sense amplifier 14. The currents through the PMOS transistors P21 and P22 are controlled by the voltage applied to the NMOS transistor N25. The drain voltage of the NMOS transistor N26, of which the gate is coupled to the inverted output (O1B) of the voltage level shifter 10, is controlled by the current through the NMOS transistors N26.

The output signal of the current mirror sense amplifier 14, or the drain voltage of the NMOS transistor N26, does not swing in full range between the supplying voltage and the ground. As shown in the FIG. 3, the output signal of the current mirror sense amplifier 14 could not be driven by the driver means 12 because the threshold voltage of the inverter 19 of the driver means 12 can become larger than the voltage level of the output signal of the current mirror sense amplifier 14.

Therefore, the output signal of the current mirror sense amplifier 14 is needed to be amplified in order to swing in full range between the supplying voltage and the ground. The invert sense amplifier 15 amplifies and inverts the output signal of the current mirror sense amplifier 14 without the loss of sensing speed.

The final output signal (OUT) of the sense amplifier of the present invention is the output signal of the invert sense amplifier 15, and denoted as C in FIG. 3.

As described above, according to the present invention, the data sensing is effectively improved in speed, reliability, etc. even when the supplying voltage becomes lower than the conventional 5 V. Also, the output signal can be kept stable and the leakage currents are effectively decreased by the node stabilizing means 13, 16 and 17.

Although the preferred embodiment of the present invention has been disclosed for illustrative purposes, those skilled in the art will appreciate that various modifications, additions and substitutions are possible, without departing from the scope and the spirit of the present invention as disclosed in the accompanying claims.

What is claimed is:

1. A sense amplifier comprising:
   a voltage level shifter for shifting a voltage level of data from a memory cell in response to a sense amplifier enable signal (SAE), wherein said voltage level shifter comprises:
   a first NMOS transistor with a drain coupled to a power line and a gate coupled to a bit line;
   a second NMOS transistor with a drain coupled to said power line and a gate coupled to a bit bar line;
   a third NMOS transistor with a drain coupled to a source of said first NMOS transistor and a gate coupled to a source of said second NMOS transistor;
   a fourth NMOS transistor with a drain coupled to said source of said second NMOS transistor and a gate coupled to said source of said first NMOS transistor; and
   a fifth NMOS transistor with a drain coupled to sources of said third and fourth NMOS transistors, a gate coupled to said sense amplifier enable signal (SAE) and a source coupled to said ground; and
   a current mirror type sense amplifier stage for amplifying said data of shifted voltage from said voltage level shifter to full range between supplying voltage and ground in response to said amplifier enable signal (SAE).

2. A sense amplifier as claimed in claim 1, wherein said sense amplifier further comprising:
   a driver means for driving said amplified data from said current mirror type sense amplifying stage.

3. A sense amplifier as claimed in claim 1, wherein said voltage level shifter further comprises:
   a shifter node stabilizing means for equalizing the voltages of said sources of said first and second NMOS transistors in the standby mode in response to said sense amplifier enable signal (SAE).

4. A sense amplifier as claimed in claim 3, wherein said shifter node stabilizing means comprises:
   a PMOS transistor with a gate coupled to said sense amplifier enable signal (SAE), a source coupled to said source of said second NMOS transistor and a drain coupled to an input of said current mirror type sense amplifying stage.

5. A sense amplifier as claimed in claim 1, wherein said current mirror type sense amplifying stage comprises:
   a current mirror sense amplifier for amplifying an output signal from said voltage level shifter; and
   an invert sense amplifier for amplifying an output signal from said current mirror sense amplifier to the full range.

6. A sense amplifier as claimed in claim 2, wherein said current mirror type sense amplifying stage comprises:
   a current mirror sense amplifier for amplifying an output signal from said voltage level shifter; and
   an invert sense amplifier for amplifying an output signal from said current mirror sense amplifier to the full range.

7. A sense amplifier as claimed in claim 5, wherein said current mirror type sense amplifying stage further comprises:
   a current mirror node stabilizing means for stabilizing said output signal of said current mirror sense amplifier and removing leakage currents in response to said sense amplifier enable signal (SAE).

8. A sense amplifier as claimed in claim 7, wherein said current mirror node stabilizing means comprises:
   a PMOS transistor with a source coupled to said power line, a drain coupled to said output of said current mirror sense amplifier and a gate coupled to said sense amplifier enable signal (SAE).

9. A sense amplifier as claimed in claim 5, wherein said current mirror type sense amplifying stage further comprises:
   a an invert node stabilizing means for stabilizing said output signal of said invert sense amplifier and removing leakage currents in response to said sense amplifier enable signal (SAE).

10. A sense amplifier as claimed in claim 9, wherein said invert node stabilizing means comprises:
    an inverter for inverting said sense amplifier enable signal (SAE); and
    an NMOS transistor with a gate coupled to an output of said inverter, a drain coupled to said output of said invert sense amplifier and a source coupled to said ground.

11. A sense amplifier as claimed in claim 7, wherein said current mirror sense amplifier comprises:
    a first PMOS transistor with a source coupled to said power line;
    a second PMOS transistor with a source coupled to said power line, a gate coupled to said gate of said first PMOS transistor and a drain coupled to said current mirror node stabilizing means;
    a first NMOS transistor with a drain coupled to said gate and drain of said first PMOS transistor and a gate coupled to an output of said voltage level shifter;
    a second NMOS transistor with drain coupled to said drain of said second PMOS transistor and a gate coupled to an inverted output of said voltage level shifter; and
    a third NMOS transistor with a drain coupled to said sources of said first and second NMOS transistors, a gate coupled to said sense amplifier enable signal (SAE) and a source coupled to said ground.

12. A sense amplifier as claimed in claim 7, wherein said invert sense amplifier comprises:
    a PMOS transistor with a source coupled to said power line, a gate coupled to said output of said current mirror sense amplifier through said current mirror node stabilizing means and a drain coupled to an output terminal thereof; and
    an NMOS transistor with a drain coupled to said drain of said PMOS transistor, a gate coupled to said output of said current mirror sense amplifier through said current mirror node stabilizing means and a source coupled to said current mirror sense amplifier.

13. A sense amplifier as claimed in claim 2, wherein said driver means comprises:
    a first inverter for inverting said amplified data from said current mirror type sense amplifying stage; and a second inverter for inverting said inverted amplified data from said first inverter.

14. A sense amplifier comprising:

a voltage level shifter for shifting a voltage level of data from a memory cell in response to a sense amplifier enable signal (SAE);

a current mirror sense amplifier for amplifying said data of shifted voltage from said voltage level shifter in response to said sense amplifier enable signal (SAE);

an invert sense amplifier for further amplifying said amplified data from said current mirror sense amplifier to full range between supplying voltage and ground voltage of said sense amplifier in response to said sense amplifier enable signal (SAE); and a current mirror node stabilizing means for stabilizing said output from said current mirror sense amplifier and removing leakage currents in response to said amplifier enable signal (SAE).

15. A sense amplifier as claimed in claim 14, wherein said current mirror sense amplifier comprises:

a first PMOS transistor with a source coupled to said supply voltage;

a second PMOS transistor with a source coupled to said supply voltage, a gate coupled to said gate of said first PMOS transistor and a drain coupled to said current mirror node stabilizing means;

a first NMOS transistor with a drain coupled to said gate and drain of said first PMOS transistor and a gate coupled to said second PMOS transistor and a gate coupled to an output of said voltage level shifter;

a second NMOS transistor with a drain coupled to said drain of said second PMOS transistor and a gate coupled to an inverted output of said voltage level shifter; and a third NMOS transistor with a drain coupled to said sources of said first and second NMOS transistors, a gate coupled to said sense amplifier enable signal (SAE) and a source coupled to said ground voltage.

16. A sense amplifier as claimed in claim 14, wherein said invert sense amplifier comprises:

a PMOS transistor with a source coupled to said supply voltage a gate coupled to said output of said current mirror sense amplifier through said current mirror node stabilizing means and a drain coupled to a driver means; and an NMOS transistor with a drain coupled to said drain of said PMOS transistor, a gate coupled to said output of said current mirror sense amplifier through said current mirror node stabilizing means and a source coupled to said current mirror sense amplifier.

17. A sense amplifier as claimed in claim 14, wherein said invert sense amplifier further includes a invert node stabilizing means for stabilizing said output signal of said invert sense amplifier and removing leakage currents in response to said sense amplifier enable signal (SAE) which has:

an inverter for inverting said sense amplifier enable signal (SAE); and an NMOS transistor with a gate coupled to an output of said inverter, a drain coupled to said output invert sense amplifier and a source coupled to said ground voltage.

18. A sense amplifier as claimed 14, wherein said current mirror node stabilizing means includes a PMOS transistor with a source coupled to said supplying voltage, a drain coupled to said output of said current mirror sense amplifier and a gate coupled to said sense amplifier enable signal (SAE).

* * * * *